United States Patent [19]

Rasmusson

[11] Patent Number: 4,471,265
[45] Date of Patent: Sep. 11, 1984

[54] APPARATUS FOR COUNTERACTING THE CATHODE CURRENT INCREASE OCCURRING DURING WARMING-UP IN A TRAVELLING-WAVE TUBE IN RESPONSE TO VARIATION IN THE GRID-CATHODE DISTANCE

[75] Inventor: Rolf W. Rasmusson, Landvetter, Sweden

[73] Assignee: Telefonaktiebolaget L M Ericsson, Stockholm, Sweden

[21] Appl. No.: 246,911

[22] Filed: Mar. 23, 1981

[30] Foreign Application Priority Data

Apr. 2, 1980 [SE] Sweden ................................ 8002538

[51] Int. Cl.³ ............................................ H01J 25/34
[52] U.S. Cl. ........................................ 315/3.5; 315/3; 315/39; 313/447; 313/459; 324/409
[58] Field of Search ....................... 313/447, 448, 459; 315/3, 3.5, 32, 39, 112, 118, 117, 116; 324/409

[56] References Cited

U.S. PATENT DOCUMENTS

| Re. 26,384 | 4/1968 | Chalk | 315/3.5 |
| 3,156,029 | 11/1964 | Simon | 313/447 X |
| 3,316,485 | 4/1967 | La Rue et al. | 324/409 |
| 3,890,545 | 6/1975 | Rosen | 315/3.5 |
| 4,321,505 | 3/1982 | Miram | 313/447 |

Primary Examiner—Saxfield Chatmon
Attorney, Agent, or Firm—Roberts Spiecens & Cohen

[57] ABSTRACT

Apparatus for compensating the injurious increase of the cathode current occurring during the initial operation period of a travelling-wave tube when, during successive warming-up, the grid first approaches the cathode and then assumes the nominal distance therefrom. The apparatus includes a distance control device measuring the deviation between the actual grid-cathode distance and the nominal distance and generating a control signal proportional to the deviation for reducing the value of the grid voltage.

1 Claim, 3 Drawing Figures

APPARATUS FOR COUNTERACTING THE CATHODE CURRENT INCREASE OCCURRING DURING WARMING-UP IN A TRAVELLING-WAVE TUBE IN RESPONSE TO VARIATION IN THE GRID-CATHODE DISTANCE

TECHNICAL FIELD

The present invention relates to an apparatus for counteracting the injurious increase of the cathode current occurring during the initial operation period of a travelling-wave tube when during warming-up the grid first approaches the cathode and then assumes the nominal distance.

BACKGROUND ART

Gain and power output of a travelling-wave tube are heavily dependent on the cathode current thereof. When, as is often the case, the tube is used in a radar installation for generating high-frequency pulses with high effect by grid control with voltage pulses, it can also be that the length and power of the generated pulses will also depend on the tube cathode current. When gain is too great, high-frequency oscillations can also occur due to saturation phenomena in the emitted radar pulses.

In its turn, the cathode current is dependent on the tube temperature, or more explicitly, variations in the grid-cathode distance which occur during warming-up, this distance first decreasing and then assumes its nominal value on attaining a constant temperature. The warming-up period can have a duration of up to two hours, the variation being heaviest during the first thirty minutes.

Part of the electrons emitted by the cathode and forming the cathode current srike the structure of the tube and give rise to an electric current in the metal parts thereof, a so-called body-current. If the cathode current increases beyond a certain limit during the heating-up period, such body current gives rise to considerable heating of the metal parts, so that the current must be interrupted before the tube is damaged. This problem cannot be accepted in a radar station.

DISCLOSURE OF INVENTION

In the knowledge that the variations and the heavy increase of cathode current depend on the grid-cathode distance variation during the warming-up time, and as the manufacturers of travelling-wave tubes supply graphs of this distance variation as a function of time, the basic idea of the invention is to follow up the variation in the grid-cathode distance and in response thereto to vary the grid voltage. In this mode, the cathode current can be kept within permitted limits during warming-up and the above mentioned drawbacks eliminated.

The invention is characterized by the disclosures of the claims.

BRIEF DESCRIPTION OF DRAWING

The invention is described in detail below with the aid of an embodiment with reference to the accompanying drawing, on which FIG. 1 schematically illustrates a portion of a travelling-wave tube.

DETAILED DESCRIPTION OF THE PREFERRED EMBODIMENT

Figure 1:
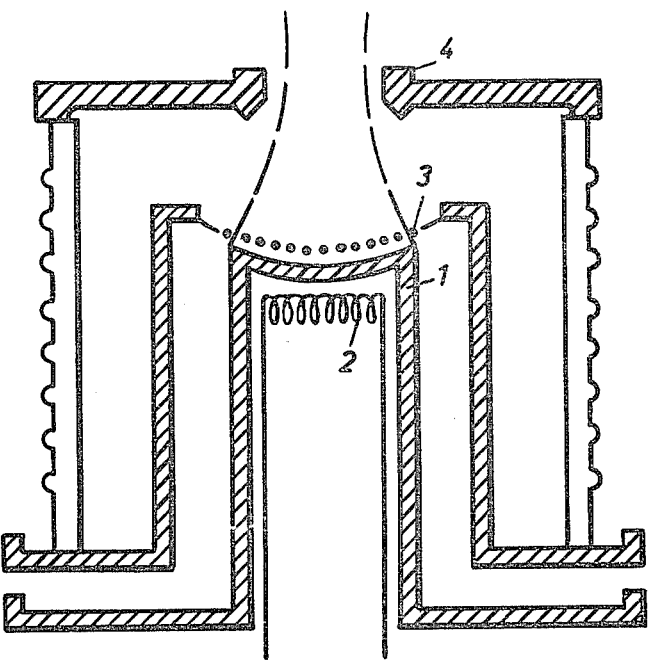

FIG. 1 schematically illustrates the electon gun of a conventional travelling-wave tube, e.g., a tube working with 15 KV acceleration voltage, 7. A cathode current pulses and grid pulses of 500 volt 0.1 A. The cathode is denoted by the numeral 1 and is heated by means of a heating coil 2. The cathode 1 has a concave shape. A control grid 3 is arranged at a short distance therefrom, e.g., 300–500 $\mu$m. A gun anode is denoted by the numeral 4, and focusses the electrons emitted from the cathode. The remaining parts of the travelling-wave tube are only schematically indicated, since they are not necessary for explaining the inventive concept. In a cold condition, the distance between grid and cathode has an initial value, but as soon as warming-up is begun, this distance diminishes, so that the cathode current increases so that there occur difficulties such as pulse length variations, output power variations and or high-frequency oscillations. There can be a wait of up to 2 hours until the distance between cathode and grid has assumed its nominal value, due to the slow warming-up.

Figure 2:
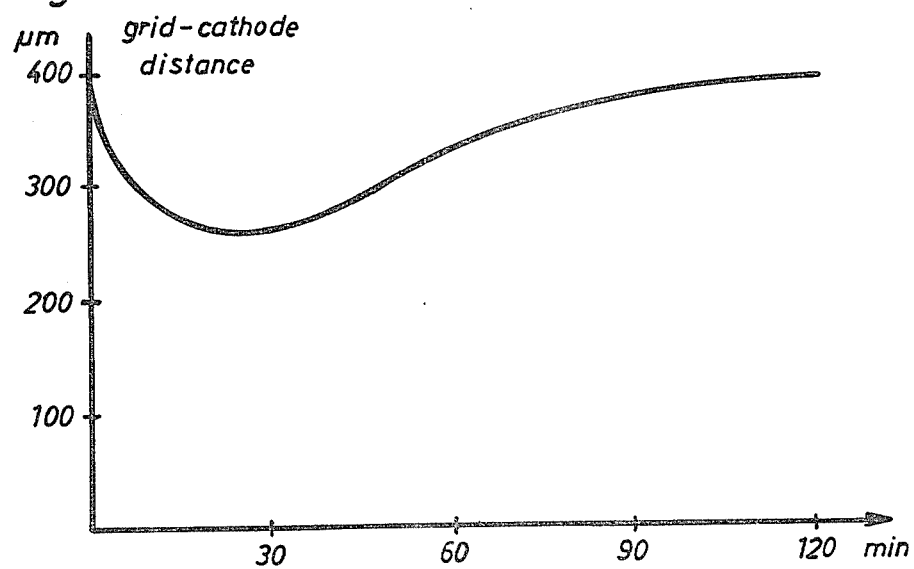
FIG. 2 is a diagram showing the variation of the grid-cathode distance in a travelling-wave tube during warming-up.

FIG. 2 is a diagram illustrating the grid-cathode distance as a function of time during a warming up period of 2 hours. The diagram accompanies the tube on delivery. As will be seen, the grid-cathode distance decreases relatively rapidly to 150 $\mu$m from the nominal value of 400 $\mu$m at the beginning of the warming-up period. This decreases results in a heavy increase of current strength, after which the grid-cathode distance reassumes its nominal value after about 2 hours. During the warming-up period, it is thus suitable to vary the current strength in response to the distance deviation from the nominal value.

A good measure of the distance is the relationship between the cathode current and grid voltage, which will be in inversely proportional to the grid-cathode distance. In accordance with the basic idea of the invention, the grid voltage must be reduced during the warming-up period, as long as the grid distance is below the nominal value. This can either be done in such a way that the grid voltage is reduced in conformity with the graph furnished by the supplier, this graph being a function of the time, e.g., by means of a clock-controlled potentiometer or by measuring the relationship between cathode current and grid voltage, this relationship being by its increase a good measure of the grid distance in relation to the nominal value. If the ratio cathode current/grid voltage is greater than the nominal value, this signifies that the grid-cathode gap is less than the nominal one, and the grid voltage must be lowered until the nominal value of the cathode current and thus the nominal value of the grid-cathode distance have been attained.

Figure 3:
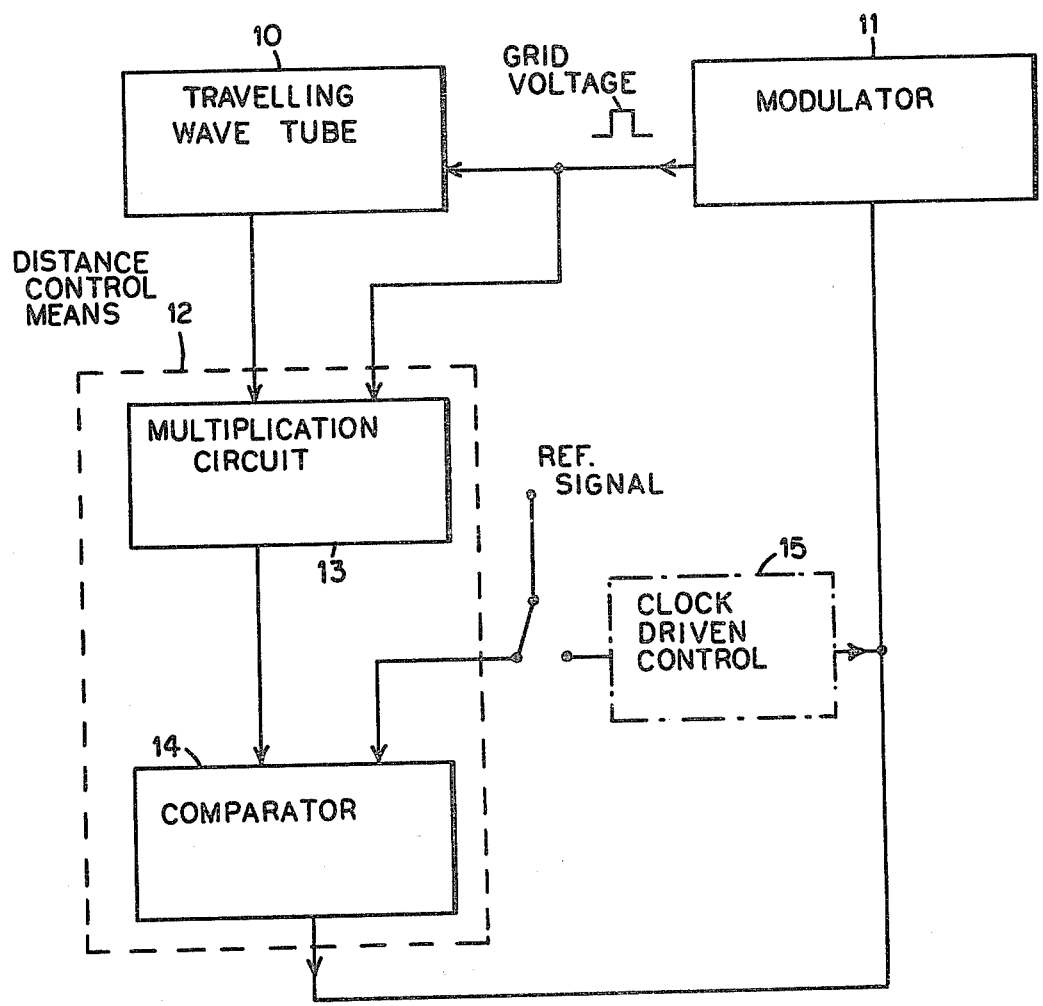
FIG. 3 illustrates an apparatus in accordance with the invention for counteracting the injurious current increase during the initial operation period.

FIG. 3 illustrates, in the form of a block diagram, apparatus for carrying out the invention. The numeral 10 denotes a travelling-wave tube, to the grid of which a modulator 11 feeds voltage pulses conventionally. A distance control means 12 includes a grid distance meter, e.g., a multiplication circuit 13, to one input of which is fed the cathode current and to the other the grid voltage. The grid distance meter can be calibrated in μm, and it transmits a signal which is proportional to the decrease of the grid-cathode gap in relation to the nominal distance. The deviation signal is applied to a comparator 14 where it is compared with a reference signal having a value corresponding to the nominal grid distance. The distance control means 12 can be simplified such that the output signal of the grid-cathode distance meter can be used directly as a control signal fed to the modulator 11, to decrease the grid voltage in relation to the nominal value.

As previously mentioned, this regulation can be done with the aid of a clock-driven control circuit 15 actuating a potentiometer in the voltage feed circuit of the grid in accordance with the graph furnished by the supplier.

It will thus be seen that the invention enables the elimination of disadvantages which can occur when the grid-cathode distance deviates from the nominal value during warming-up.

What we claim is:

1. An apparatus for compensating increase of cathode current occurring during the initial operation period of a travelling-wave tube including a cathode and grid when, during warming-up, the grid, to which a grid voltage is applied, first approaches the cathode and then assumes a nominal distance therefrom, said apparatus comprising a distance control means for measuring deviation between actual grid-cathode distance and the nominal grid-cathode distance and means responsive thereto for generating a control signal proportional to the deviation for reducing the value of the grid voltage, said distance control means comprising means for multiplying instantaneous values of the cathode current and grid voltage to produce a signal corresponding to the grid-cathode distance, comparator means for comparing said signal with a reference signal corresponding to the nominal distance, and means operative in response to said comparision for generating a control signal for reducing the value of the grid voltage.

* * * * *